United States Patent [19]

Masaki et al.

[11] Patent Number: 4,704,524

[45] Date of Patent: Nov. 3, 1987

[54] ATTACHMENT FOR ELECTRONIC SWITCH

[75] Inventors: Akio Masaki, Shino; Yoshio Moriyasu, Omihachiman; Kenji Ueda; Kiyoshi Miyamoto, both of Otsu; Yasushi Matsuoka, Takatsuki, all of Japan

[73] Assignee: Omron Tateisi Electronics Co., Kyoto, Japan

[21] Appl. No.: 16,562

[22] Filed: Feb. 19, 1987

Related U.S. Application Data

[63] Continuation-in-part of Ser. No. 898,830, Aug. 20, 1986, abandoned, which is a continuation of Ser. No. 727,047, Apr. 25, 1985, abandoned.

[30] Foreign Application Priority Data

Apr. 25, 1984 [JP] Japan .................................. 59-62021

[51] Int. Cl.[4] .............................................. H01J 5/02
[52] U.S. Cl. .................................................... 250/239
[58] Field of Search ....................... 250/216, 229, 239; 315/159; 354/126

[56] References Cited

U.S. PATENT DOCUMENTS 3,408,501 10/1968 Thompson ......................... 250/239
3,524,068 8/1970 Zorn .................................... 250/239

Primary Examiner—Eugene R. LaRoche
Assistant Examiner—Steven J. Mottola
Attorney, Agent, or Firm—Schwartz, Jeffery, Schwaab, Mack, Blumenthal & Evans

[57] ABSTRACT

An attachment for an electronic switch having an outlet tube in one embodiment includes a first clamp member including a pair of legs having respective hooks on ends thereof, and a second clamp member having a pair of locking pawls for locking engagement with the hooks, respectively. In a second embodiment the clamp members are identical with a leg and hook and a pawl on each member. The second clamp member having a pair of cavities in which the legs can be fitted, respectively, the first and second clamp members being connectable together to hold the outlet tube of the electronic switch therebetween. The first and second clamp members as connected together are slidable between a first position in which one of the first and second clamp members is displaced away from the other while being retained together by the hooks and the locking pawls and the outlet tube is rotatable between the first and second clamp members, and a second position in which the one of the first and second clamp members is pushed against the other and the outlet tube is fixed in position between the first and second clamp members.

15 Claims, 15 Drawing Figures

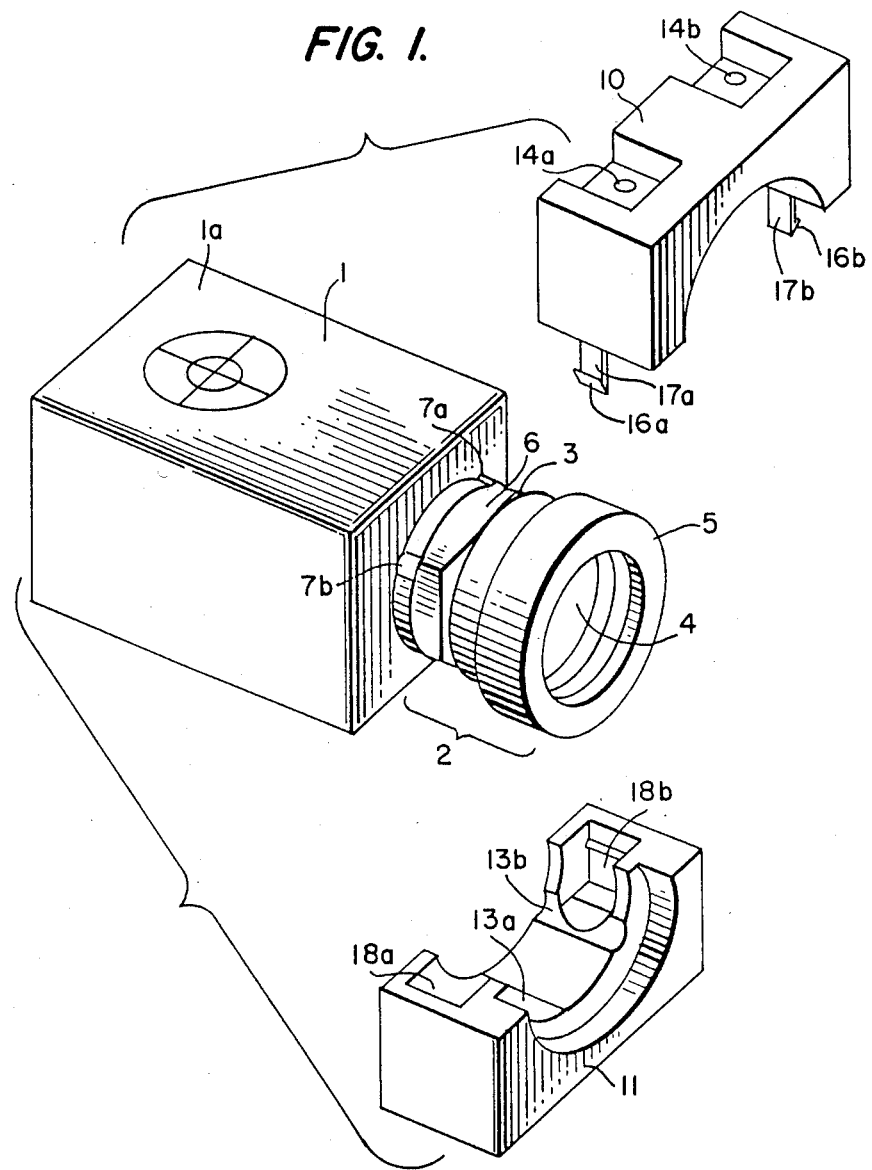

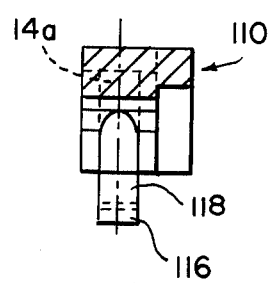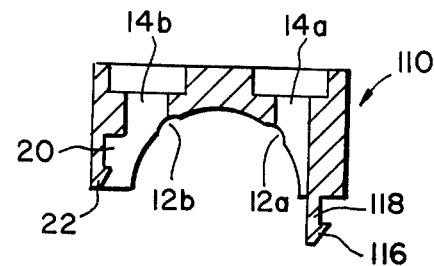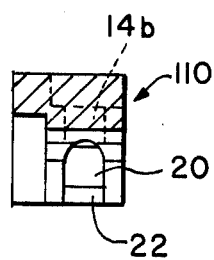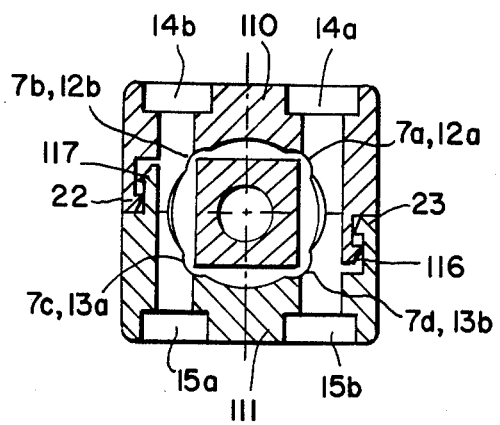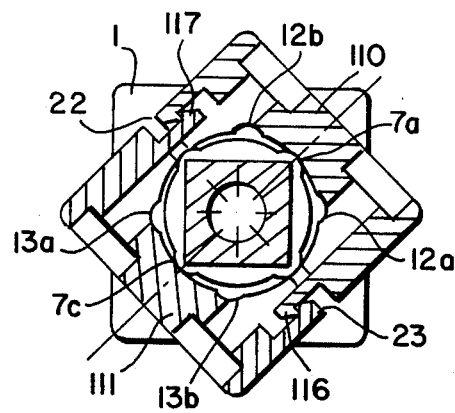

ATTACHMENT FOR ELECTRONIC SWITCH

CROSS REFERENCE

This application is a continuation-in-part of application Ser. No. 898,830, filed Aug. 20, 1986, now abondoned a continuation of application Ser. No. 727,047, filed Apr. 25, 1985, now abandoned.

BACKGROUND OF THE INVENTION

1. Field of the Invention

The present invention relates to an attachment for attaching an electronic switch, such as a proximity switch or a photoelectric switch having a casing, in any desired direction.

2. Related Art

Proximity switches or photoelectric switches with casings have a detecting surface on the front or side of the casing. Since the casing is attached in one direction only, the direction of the detecting surface cannot be changed freely. When the detecting surface in on the side of the detector head, however, it is frequently necessary to vary the detecting direction. Therefore, a rotatable attachment should be used to attach the switch casing to an attachment base.

One prior art rotatable electronic switch has an attachment comprising two or four members. When the detecting direction is to be changed by rotating the switch casing, the attachment members are required to be disassembled, combined again in a desired direction, and attached again to the attachment base. In such a reassembling process, the attachment members are liable to scatter around, and it is both tedious and time-consuming to change the detecting direction.

SUMMARY OF THE INVENTION

In view of the aforesaid problems with the conventional attachment for electronic switches, it is an object of the present invention to provide an attachment for an electronic switch which can easily change the detecting direction of the electronic switch without disassembling the attachment at the time of rotating the switch casing.

According to one embodiment of the present invention, an attachment for an electronic switch having an outlet tube includes a first clamp member including a pair of legs having respective hooks on ends thereof, and a second clamp member having a pair of locking pawls for locking engagement with the hooks, respectively, the second clamp member having a pair of cavities in which the legs can be fitted, respectively, the first and second clamp members being connectable together to hold the outlet tube of the electronic switch therebetween. The first and second clamp members as connected together are slidable between a first position in which one of the first and second clamp members is displaced away from the other while being retained together by the hooks and the locking pawls and the outlet tube is rotatable between the first and second clamp members, and a second position in which the one of the first and second clamp members is pushed against the other and the outlet tube is fixed in position between the first and second clamp members.

A second embodiment includes a leg and hook on each clamp member and a cooperating pawl on each of the other clamp members. Thus, each clamp member has an identical configuration.

By sandwiching the outlet tube between the first and second clamp members and fixing the clamp members together, the clamp members are retained together against separation and combined with the outlet tube of the switch. For rotating a detecting surface of the switch, the clamp members as coupled are loosened from each other, then the switch is rotated, and the clamp members are fixed together so that the detecting surface can be oriented in the desired direction. Since the clamp members are coupled to the switch at all times, they do not tend to scatter around at the time they are loosened to turn the switch. Therefore, the attachment for the switch can easily be handled in use.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 1 is an exploded perspective view of an attachment for an electronic switch according to the present invention;

FIGS. 8(a), 8(b) and 8(c) are cross-sectional views of the clamp members;

FIG. 9 is a cross-sectional view of the clamp members of the embodiment of FIG. 7 to which the switch body is attached; and FIG. 10 is a cross-sectional view showing the manner in which the clamp members of FIGS. 7-9 are rotated with respect to the switch body.

DETAILED DESCRIPTION OF THE PREFERRED EMBODIMENTS

1. Embodiment of FIGS. 1-6

Figure 2A:
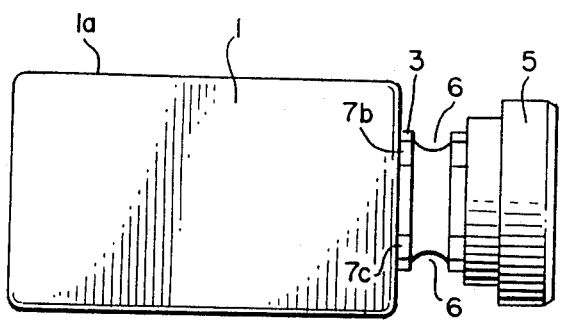
FIG. 2(a) is a side elevational view of a switch body.
Figure 2B:
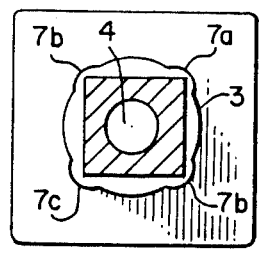
FIG. 2(b) is a cross-sectional view of the switch body.

As shown in FIGS. 1, 2(a) and 2(b), an electronic switch has a switch body 1 in the form of a casing and a detecting surface 1a on one side thereof, i.e., an upper side as shown. An attachment member 2 is mounted on the back of the switch body 1, the attachment member 2 extending along an axis of the switch body 1. The attachment member 2 is composed of an outlet tube 3 coupled to the switch body 1 and a conduit ring 5 having a central conduit hole 4 and connected coaxially to the outlet tube 3. The outlet tube 3 has in its axially central portion four straight grooves 6 extending parallel to the four sides of the back of the switch body 1, and four curved projections 7a through 7d projecting from four corners and extending parallel to the axis of the outlet tube 3.

Figure 3A:
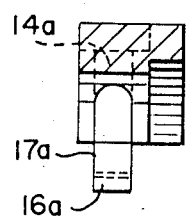
FIGS. 3(a) and 3(b) are cross-sectional views of one clamp member.
Figure 3B:
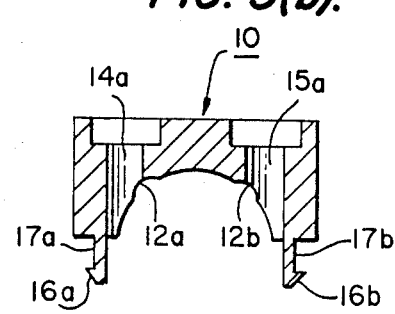
Figure 4A:
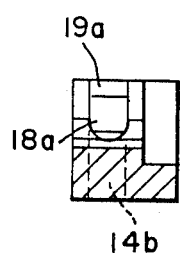
FIGS. 4(a) and 4(b) are cross-sectional views of the other clamp member.
Figure 4B:
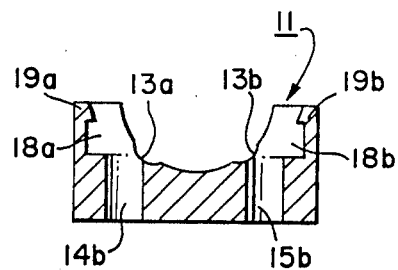

The switch body 1 is attached by the attachment member 2 to a pair of upper and lower clamp members 10, 11. As shown in FIGS. 1, 3(a) and 3(b), the clamp member 10 has set in its lower surface a substantially semicircular recess including two curved symmetrically positioned grooves 12a, 12b extending parallel to the axis of the recess. As illustrated in FIGS. 1, 4(a) and 4(b), the other clamp member 11 has set in its upper surface a substantially semicircular recess including two curved symmetrically positioned grooves 13a, 13b extending parallel to the axis of the recess. The upper clamp member 10 has bolt holes 14a, 15a through which bolts extend downwardly to attach the clamp members. As shown in FIG. 3(b), the clamp member 10 has a pair of laterally spaced legs 17a, 17b projecting from the lower surface and having outward hooks 16a, 16b. As shown in FIG. 4(b), the lower clamp member 11 has a pair of laterally spaced bolt holes 14b, 15b for registry with the bolt holes 14a, 15a, respectively, in the upper clamp member 10. The clamp member 11 includes cavities 18a, 18b defined in side walls thereof and upwardly of the bolt holes 14b, 15b, the side walls terminating in locking pawls 19a, 19b for locking engagement with the hooks 16a, 16b of the upper clamp member 10.

The clamp members 10, 11 of the foregoing construction are combined around the attachment member 2 of the switch body 1. More specifically, since the semicircular recesses in the clamp members 10, 11 are symmetrical in shape, they are combined to provide a substantially elliptical through-hole, in which the outlet tube 3 of the attachment member 2 is fitted. At this time, the logs 17a, 17b of the clamp member 10 are inserted respectively into the cavities 18a, 18b past the locking pawls 19a, 19b, whereupon the clamp members 10, 11 are connected together against separation. The ends of the hooks 16a, 16b are held against the inner surfaces of the cavities 18a, 18b in the clamp member 11, the hooks 16a, 16b being slightly slidable in the cavities 18a, 18b.

Figure 5:
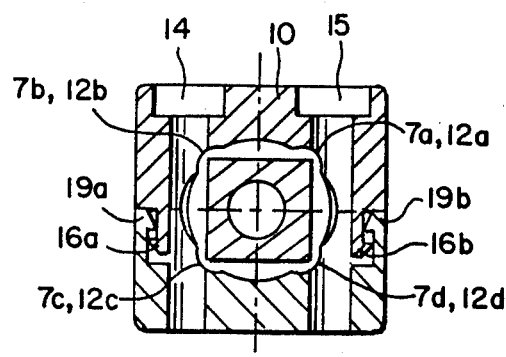
FIG. 5 is a cross-sectional view of the clamp members to which the switch body is attached.

As shown in FIG. 5, the clamp member 10 is then pushed toward the clamp member 11 with the curved projections 7a through 7d of the outlet tube 3 being fitted respectively in the curved grooves 12a, 12b, 13a, 13b of the clamp members 10, 11, and bolts (not shown) are inserted through the bolt holes 14a, 15a, 14b, 15b and connected to a base (not shown). Because of the grooves 6, the bolts as inserted through the bolt holes do not contact the outlet tube 3. The attachment member 2 is now fastened in position by the clamp members 10, 11 fixed to the base. Therefore, the switch body 1 is secured to the base.

Figure 6:
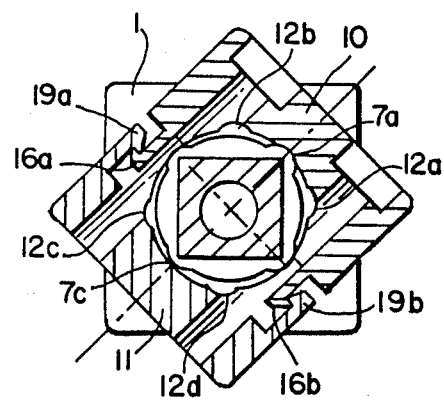
FIG. 6 is a cross-sectional view showing the manner in which the clamp members are rotated with respect to the switch body.
Figure 7:
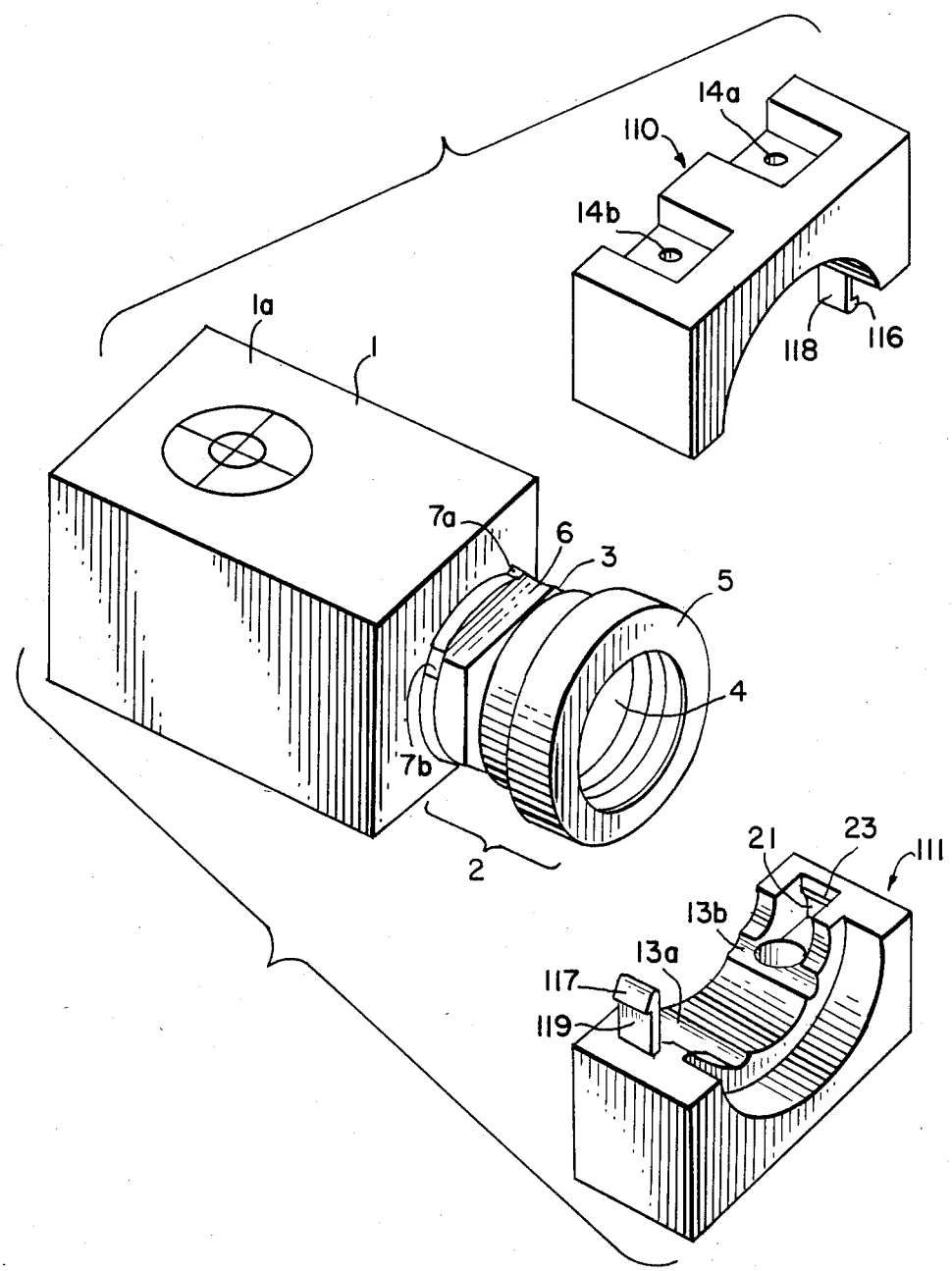
FIG. 7 is an exploded perspective view of an attachment for an electronic switch according to a second embodiment of the present invention.

For rotating the switch body 1 to orient the detecting surface 1a in a different direction, the now-illustrated bolts are loosened and the upper clamp member 10 is pulled upwardly until the hooks 16a, 16b of the legs 17a, 17b abut against the locking pawls 19a, 19b, respectively. Now, the through-hole defined jointly by the clamp members 10, 11 is enlarged to bring the curved projections 7a through 7d of the outlet tube 3 out of fitting engagement with the curved grooves 12a, 12b, 13a, 13b of the clamp members 10, 11. As shown in FIG. 6, the switch body 1 or the clamp members 10, 11 can be rotated with the curved projections 7a through 7d sliding against the inner surfaces of the semicircular recesses. When rotated through 90°, the curved projections 7a through 7d are fitted into the curved grooves 12a, 12b, 13a, 13b. The clamp member 10 is then pushed toward the clamp member 11 to fix the attachment member 2 in position. The bolts through the bolt holes 14, 15 are then tightened to secure the clamp members 10, 11 and the switch body 1 to the base. The switch body 1 can be rotated as desired without separating the clamp members 10, 11 from each other, so that the detecting surface 1a will be oriented in any one of the four directions.

2. Embodiment of FIGS. 7–10

In the embodiment of FIGS. 7–10, the switch body 1 is attached by the attachment member 2 to a pair of upper and lower clamp members 110, 111. As shown in FIGS. 7, 8(a), 8(b) and 3(c), the clamp member 110 has set in its lower surface a substantially semicircular recess including two curved symmetrically positioned grooves 12a, 12b extending parallel to the axis of the recess. The other clamp member 111 is formed identically to clamp member 110. The clamp members 110, 111 have bolt holes 14a, 14b through which bolts extend downwardly to attach the clamp members. As shown in FIG. 8(b), the clamp members 110 and 111 have legs 118, 119, respectively, projecting from the lower surface and have an outward hook 116 and 117, respectively. Each clamp member 110 and 111 includes a cavity 20, 21 defined in a side wall thereof and upwardly of the bolt hole 14b, the side wall terminating in locking pawl 22, 23 for locking engagement with the hooks 16 of the other clamp member.

The clamp members 110, 111 of the foregoing construction are combined around the attachment member 2 of the switch body 1 in a manner similar to that described in the embodiment of FIGS. 1–6. More specifically, since the semicircular recesses in the clamp members 110, 111 are symmetrical in shape, they are combined to provide a substantially elliptical through-hole, in which the outlet tube 3 of the attachment member 2 is fitted. At this time, the legs 118, 119 of the clamp members are inserted respectively into the cavities 20, 21 past the locking pawls 22, 23, whereupon the clamp members 110, 111 are connected together against separation. The ends of the hooks 116, 117 are held against the inner surfaces of the cavities 20, 21, the hooks 116, 117 being slightly slidable in the cavities 20, 21.

As shown in FIG. 9, the clamp member 110 is then pushed toward the clamp member 111 with the curved projections 7a through 7d of the outlet tube 3 being fitted respectively in the curved grooves 12a, 12b, 13a, 12b of the clamp members 110, 111, and bolts (not shown) are inserted through the bolt holes 14a, 15a, 14b, 15b and connected to a base (not shown). Because of the grooves 6, the bolts as inserted through the bolt holes do not contact the outlet tube 3. The attachment member 2 is now fastened in position by the clamp members 110, 111 fixed to the base. Therefore, the switch body 1 is secured to the base.

For rotating the switch body 1 to orient the detecting surface 1a in a different direction, the non-illustrated bolts are loosened and the upper clamp member 110 is pulled upwardly until the hooks 116, 117 of the legs 118, 119 abut against the locking pawls 22, 23, respectively. Now, the through-hole defined jointly by the clamp members 110, 111 is enlarged to bring the curved projections 7a through 7d of the outlet tube 3 out of fitting engagement with the curved grooves 12a, 12b, 13a, 13b of the clamp members 110, 111. As shown in FIG. 10, the switch body 1 or the clamp members 110, 111 can be rotated with the curved projections 7a through 7d sliding against the inner surfaces of the semicircular recesses. When rotated through 90°, the curved projections 7a through 7d are fitted into the curved grooves 12a, 12b, 13a, 13b. The clamp member 110 is then pushed toward the clamp member 111 to fix the attachment member 2 in position. The bolts through the bolt holes 14, 15 are then tightened to secure the clamp members 110, 111 and the switch body 1 to the base. The switch body 1 can be rotated as desired without separating the clamp members 110, 111 from each other, so that the detecting surface 1a will be oriented in any one of the four directions.

In the foregoing embodiments, the switch body 1 is of a rectangular parrallelepiped shape, with the detecting surface located laterally thereof and switchable selectively in the four directions. However, the number of curved projections of the outlet tube and the number of curved grooves in the clamp members may be varied to allow the switch body to be oriented in a desired number of directions, e.g., six or eight directions or to be fixed at any desired angle. With respect to an electronic switch having a detecting surface facing in a forward direction, i.e., a photoelectric switch, the range in which an object can be detected by the switch can be varied by differently positioning the light-emitting element and the photodetector.

While several embodiments of the invention have been described, it will be understood that it is capable of still further modifications and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. An attachment for an electronic switch having an outlet tube, comprising:
   (a) a first clamp member including a pair of legs having respective hooks on ends thereof;
   (b) a second clamp member having a pair of locking pawls for locking engagement with said hooks, respectively, said second clamp member having a pair of cavities in which said legs can be fitted, respectively, said first and second clamp members being connectable together to hold the outlet tube of the electronic switch therebetween; and
   (c) said first and second clamp members as connected together being slidable between a first position in which one of said first and second clamp members is displaced away from the other while being retained together by said hooks and said locking pawls and said outlet tube is rotatable between said first and second clamp members, and a second position in which said one of the first and second clamp members is pushed against the other and said outlet tube is fixed in position between said first and second clamp members.

2. An attachment for an electronic switch having an outlet tube including first angularly spaced fitting portions, according to claim 1, wherein said first and second clamp members have arcuate recesses including second angularly spaced fitting portions alignable with said first fitting portions, respectively, of said outlet tube, said first and second fitting portions being interfitable to orient said electronic switch in one of angular spaced directions when said outlet tube is fixed between said first and second clamp members.

3. An attachment according to claim 2, wherein said first fitting portions comprise curved projections projecting radially outwardly, and said second fitting portions comprise curved grooves defined in inner surfaces of said arcuate recesses of said first and second clamp members.

4. An attachment for an electronic switch having an outlet tube, comprising:
   (a) first and second clamp members;
   (b) said first clamp member including at least one leg having a hook on an end thereof;
   (c) said second clamp member having at least one locking pawl for locking engagement with said hook, said second clamp member having at least one cavity in which said leg can be fitted, said first and second clamp members being connectable together to hold the outlet tube of the electronic switch therebetween; and
   (d) said first and second clamp members as connected together being slidable between a first position in which one of said first and second clamp members is displaced away from the other while being retained together by said at least one hook and locking pawl and said outlet tube is rotatable between said first and second clamp members, and a second position in which said one of the first and second clamp members is pushed against the other and said outlet tube is fixed in position between said first and second clamp members.

5. An attachment for an electronic switch having an outlet tube including first angularly spaced fitting portions, according to claim 4, wherein said first and second clamp members have arcuate recesses including second angularly spaced fitting portions alignable with said first fitting portions, respectively, of said outlet tube, said first and second fitting portions being interfitable to orient said electronic switch in one of angular spaced directions when said outlet tube is fixed between said first and second clamp members.

6. An attachment according to claim 5, wherein said first fitting portions comprise curved projections projecting radially outwardly, and said second fitting portions comprise curved grooves defined in inner surfaces of said arcuate recesses of said first and second clamp members.

7. An attachment according to claim 4, wherein said first clamp member includes two said legs and hooks and said second clamp member has two of said pawls.

8. An attachment according to claim 4, wherein said first clamp members each have one leg and hook and one pawl.

9. An attachment according to claim 4, wherein said clamp members are substantially identical.

10. An attachment for an electronic switch having an outlet tube, comprising:
    (a) a first clamp member;
    (b) a second clamp member;
    (c) said clamp members having thereon:
       (1) a pair of legs with respective hooks on ends thereof,
       (2) a pair of locking pawls for respectively locking engagement with said hooks, and
       (3) a pair of cavities in which said legs can be respectively fitted;
    (d) said first and second clamp members being connectable together to hold the outlet tube of the electronic switch therebetween; and
    (e) said first and second clamp members as connected together being slidable between a first position in which one of said first and second clamp members is displaced away from the other while being retained together by said hooks and said locking pawls and said outlet tube is rotatable between said first and second clamp members, and a second position in which said one of the first and second clamp members is pushed against the other and said outlet tube is fixed in position between said first and second clamp members.

11. An attachment for an electronic switch having an outlet tube including first angularly spaced fitting portions, according to claim 10, wherein said first and second clamp members have arcuate recesses including second angularly spaced fitting portions alignable with said first fitting portions, respectively, of said outlet tube, said first and second fitting portions being interfittable to orient said electronic switch in one of angular spaced directions when said outlet tube is fixed between said first and second clamp members.

12. An attachment according to claim 11, wherein said first fitting portions comprise curved projections projecting radially outwardly, and said second fitting portions comprise curved grooves defined in inner surfaces of said arcuate recesses of said first and second clamp members.

13. An attachment according to claim 10, wherein said pair of legs are on one of said clamp members, and said pair of cavities is on the other clamp member.

14. An attachment according to claim 10, wherein one of said legs and one of said cavities is on said first clamp member and the other of said legs and the other of said cavities is on said second clamp member.

15. An attachment according to claim 10, wherein said clamp members are substantially identical.

* * * * *